United States Patent [19]
Shin et al.

[11] Patent Number: 6,045,369
[45] Date of Patent: Apr. 4, 2000

[54] DEVICE FOR MOUNTING SEMICONDUCTOR PACKAGE AND METHOD OF FABRICATING SAME

[75] Inventors: Myeong-Soo Shin; Joon-Ki Hong, both of Choongcheongbuk-Do, Rep. of Korea

[73] Assignee: LG Semicon Co., Ltd., Cheongju, Rep. of Korea

[21] Appl. No.: 08/901,657

[22] Filed: Jul. 28, 1997

[30] Foreign Application Priority Data

Jul. 29, 1996 [KR] Rep. of Korea ............... 96-30959

[51] Int. Cl.$^7$ ................................................ H01R 9/09
[52] U.S. Cl. ........................................... 439/71; 439/330
[58] Field of Search .................. 174/52.1; 361/809, 361/810; 206/724, 722; 439/70, 71, 73, 912, 330

[56] References Cited

U.S. PATENT DOCUMENTS

| | | | |
|---|---|---|---|
| 3,912,984 | 10/1975 | Lockhart, Jr. et al. | 317/101 |
| 4,435,724 | 3/1984 | Ralstin | 439/526 |
| 5,117,330 | 5/1992 | Miazga | 361/760 |
| 5,428,248 | 6/1995 | Cha | 257/676 |

*Primary Examiner*—Kristine Kincaid
*Assistant Examiner*—Hung V Ngo
*Attorney, Agent, or Firm*—Fleshner & Kim

[57] ABSTRACT

An improved device for mounting a semiconductor package when testing electrical characteristics of the semiconductor package is capable of reducing stress which is applied to the semiconductor package. The device includes a shaped body, a plurality of spaced-apart protrusions that vertically extend from a first pair of opposing upper sides of the body, a plurality of guide blocks that extend from a second pair of opposing upper sides of the body, and a plurality of leads that extend from the top surface of the body and down side surfaces of the body. The leads may include inner portions that extend inward from the first pair of opposing upper sides of the body, and outer portions that extend down the sides of the body. In addition, a plurality of guide hooks for holding a semiconductor package may be formed on upper surfaces of the protrusions and/or the guide blocks.

17 Claims, 6 Drawing Sheets

DEVICE FOR MOUNTING SEMICONDUCTOR PACKAGE AND METHOD OF FABRICATING SAME

BACKGROUND OF THE INVENTION

1. Field of the Invention

The present invention relates to a device for mounting a semiconductor package, and particularly to an improved device for mounting a semiconductor which is capable of mounting a bottom leaded semiconductor package (BLP) for testing, and to methods of fabricating the device.

2. Background of the Related Art

FIGS. 1A and 1B are, respectively, a vertical cross-sectional view and a bottom view of a BLP. As shown therein, a lead frame 2 includes a plurality of substrate connection leads 2a, the bottom portions of which are intended to be connected to a substrate (not shown). A plurality of chip connection leads 2b extend from the substrate connection leads 2a. A semiconductor chip 1 is bonded to the upper portion of the substrate connection lead 2a by an adhesive 3. A plurality of wires 4 are provided for electrically connecting chip pads (not shown) and the chip connection leads 2b of the lead frame 2. A body 5 is formed by encapsulating the wires 4, the semiconductor chip 1, and the leads 2a and 2b of the lead frame 2 using a molding resin 5. As shown on FIG. 1B, predetermined portions of the substrate connection leads 2a are partially exposed to the outside. The above art is described in U.S. Pat. No. 5,428,248, which issued Jun. 27, 1995.

The above-described bottom leaded semiconductor package is generally only used after first being subjected to an electrical characteristic test. To test the package, a solder paste is coated on the pads of a printed circuit board (PCB) 10, and the semiconductor package 20 (as shown in FIGS. 1A and 1B) is mounted thereon. Next, an infrared reflow process is performed to attach the semiconductor package 20 to the PCB 10. Such an assembly is shown in FIGS. 2A and 2B. Thereafter, the PCB 10, on which the semiconductor package 20 is mounted, is mounted on a test apparatus (not shown), and an electrical characteristic test is performed to determine whether the package has any defects. When a defect is found, the IR reflow process is performed again so as to remove the defective package, another semiconductor package is mounted in its place, and the entire PCB 10 is re-tested.

However, since the electrical characteristic test is performed only after attaching the semiconductor package 20 on the PCB 10, solder may be undesirably pasted to the semiconductor package 20. Also, because the IR reflow process is performed prior to testing, the semiconductor package 20 may incur thermal damage, thus causing defective packages.

The above references are incorporated by reference herein where appropriate for teachings of additional or alternative details, features and/or technical background.

SUMMARY OF THE INVENTION

Accordingly, it is an object of the present invention to provide a device for mounting and testing a semiconductor package which overcomes the problems encountered by related art devices.

It is another object of the present invention to provide an improved device for mounting a semiconductor package which is capable of reducing the stress which is applied to the semiconductor package during testing.

To achieve the above objects, a novel device for mounting a semiconductor package includes a horizontal planer shaped body, a plurality of spaced-apart protrusions vertically protruding from a first pair of opposing upper sides of the body, a plurality of guide blocks vertically extending from a second pair of opposing upper sides of the body, a plurality of inner connection leads that extend inwardly from the first pair of upper sides of the body, the inner connection leads including insertion portions that are inserted between lower portions of adjacent ones of the protrusions, a plurality of outer connection leads that extend from the insertion portion of the inner connection leads and that extend along the first pair of upper sides of the body, and a plurality of guide hooks that are vertically disposed at the upper surfaces of each protrusion.

BRIEF DESCRIPTION OF THE DRAWINGS

The invention will be described in detail with reference to the following drawings in which like reference numerals refer to like elements, and wherein:

FIGS. 3A through 3C are views showing a semiconductor package device mounting device according to the present invention, of which:

FIG. 3A is an end view of the semiconductor package mounting device;

FIG. 3B is a side view of the semiconductor package mounting device;

FIG. 3C is a plan view of the semiconductor package mounting device;

DETAILED DESCRIPTION OF PREFERRED EMBODIMENTS

The device for mounting a semiconductor package according to the present invention will now be explained with reference to the accompanying drawings.

Figure 1A:
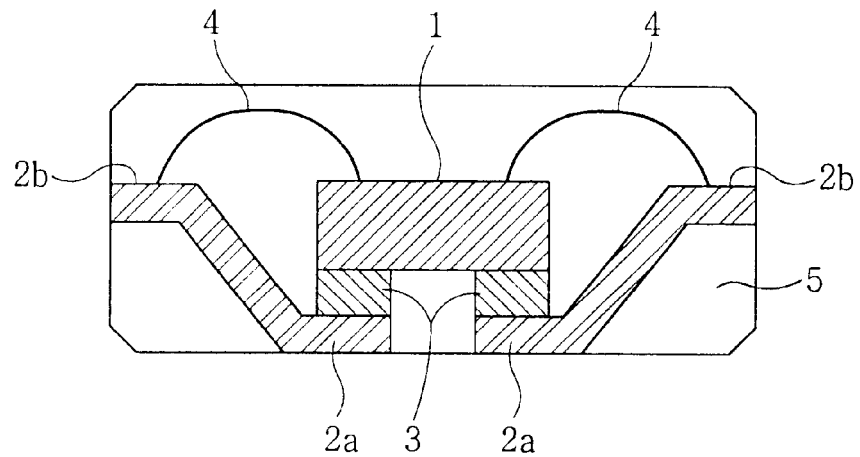
FIGS. 1A and 1B are, respectively, a vertical cross-sectional view and a bottom view of a bottom leaded semiconductor package.
Figure 1B:
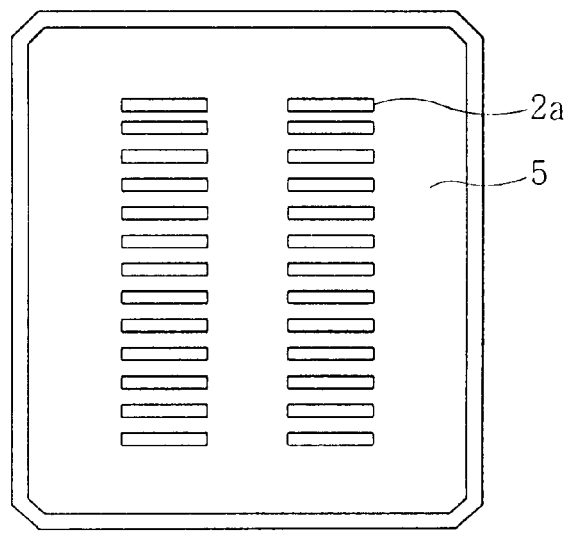
Figure 2A:
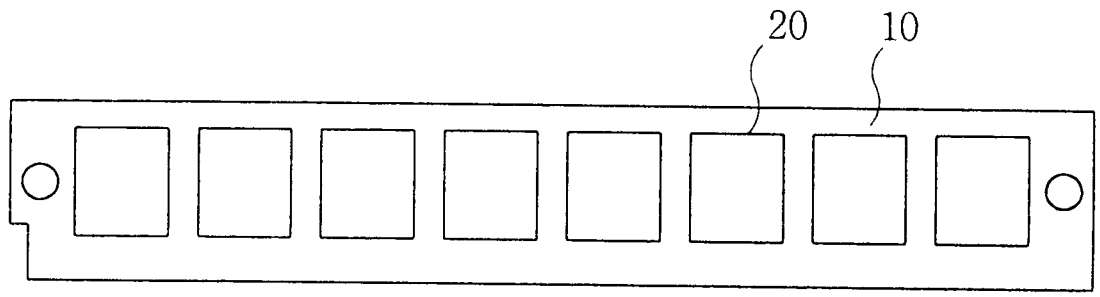
FIGS. 2A and 2B are, respectively, a plan view and a front view showing bottom leaded semiconductor packages mounted on a printed circuit board.
Figure 2B:
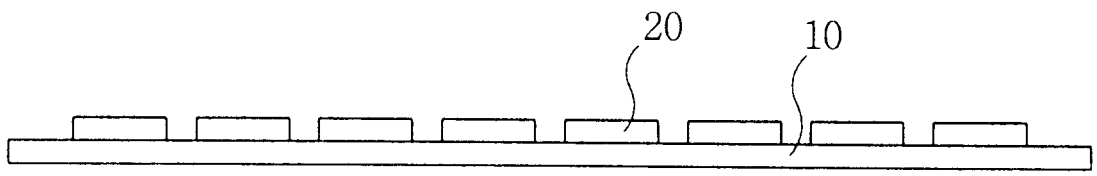
Figure 3A:
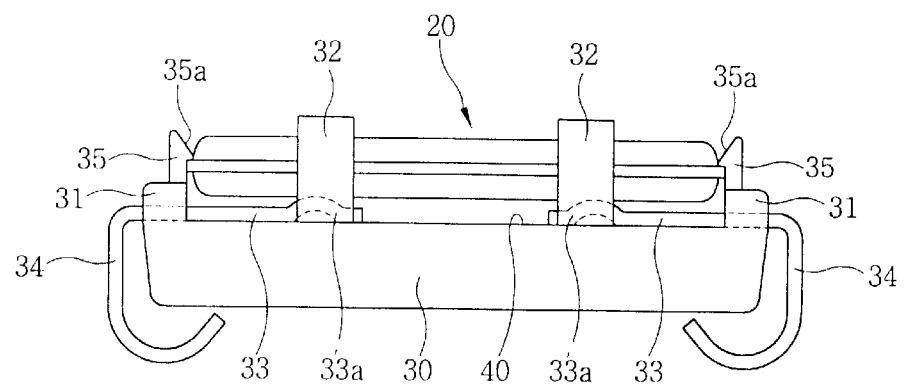
Figure 3B:
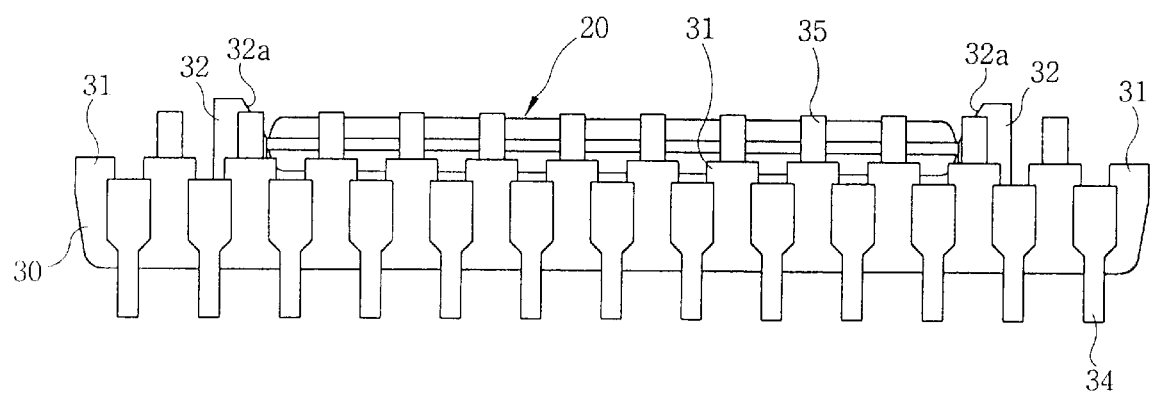
Figure 3C:
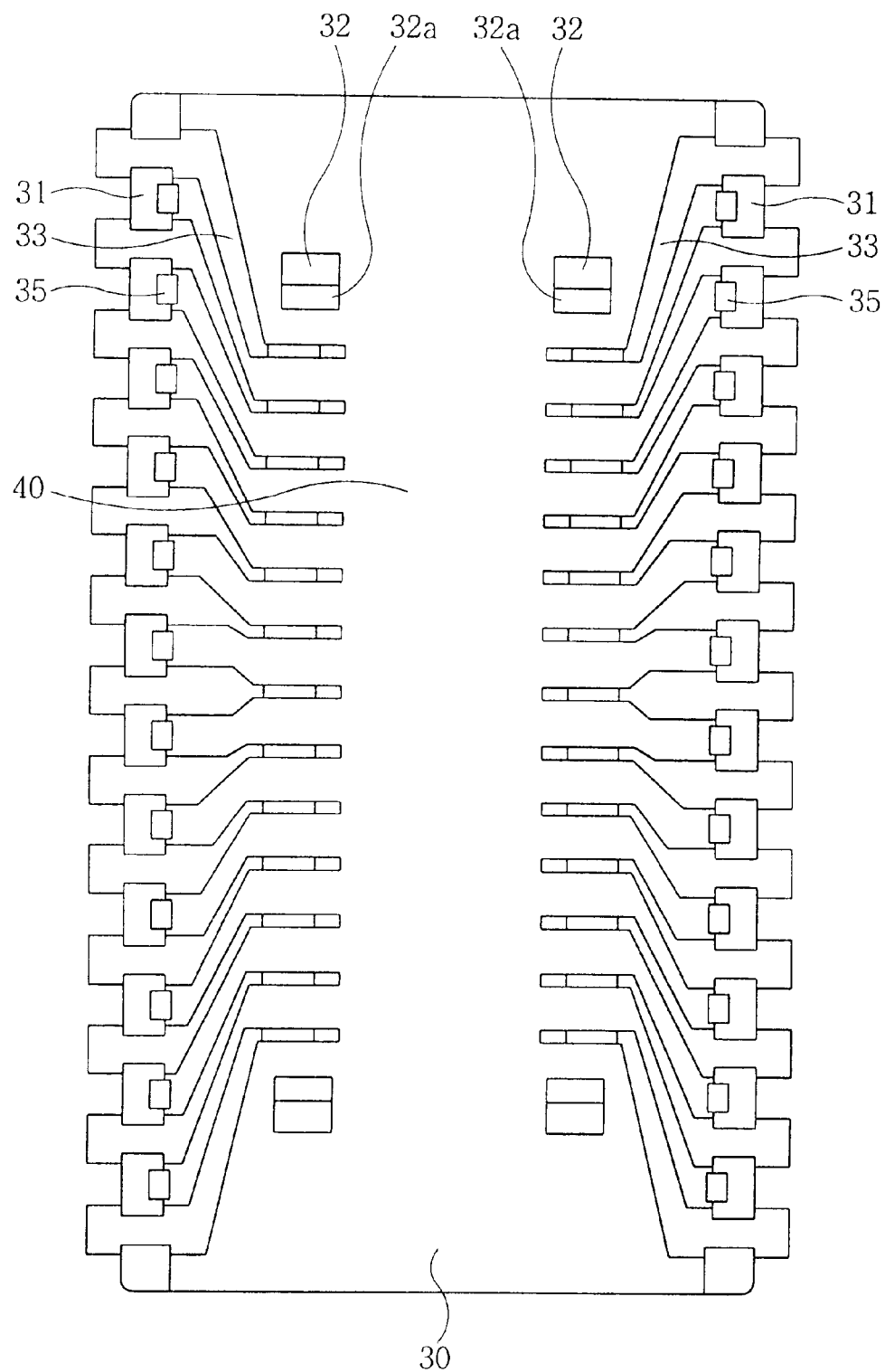

FIGS. 3A through 3C are views showing a semiconductor package mounting device according to the present invention. FIGS. 3A and 3B show a state where a conventional bottom leaded semiconductor package (hereinafter, called "a semiconductor package") is mounted, and FIG. 3C shows a state where a semiconductor package is not mounted on the device.

The mounting device generally corresponds in shape to a typical semiconductor package, namely being rectilinear. A plurality of spaced-apart protrusions 31 are formed along a first pair of opposing sides of the upper portion of a body 30. A plurality of guide blocks 32 that extend perpendicular to the upper surface of the body 30 are formed along a second pair of opposing sides of the upper portion of the body 30. A cavity 40 in which the device 20 is to be mounted is formed at an upper central portion of the body 30 by the protrusions 31 and the guide blocks 32. The upper surfaces of the guide blocks 32a are inclined toward the cavity 40 so that a semiconductor package 20 can be easily slidably inserted along the inclined portions 32a.

A plurality of leads are arranged along the first pair of opposing sides of the upper portion of the body 30. Each of the leads includes an inner connection lead portion 33 that is inserted between adjacent ones of the protrusions 31, and that extends inwardly towards the opposite side. In addition, an upwardly curved portion 33a of each inner connection lead portion 33 is bent upwardly, away from the upper portion of the body 30. The upwardly curved portions 33a are intended to connect with the bottom leads 2a which are exposed at the bottom portion of the semiconductor package 20, as shown in FIG. 3A.

Figure 4:
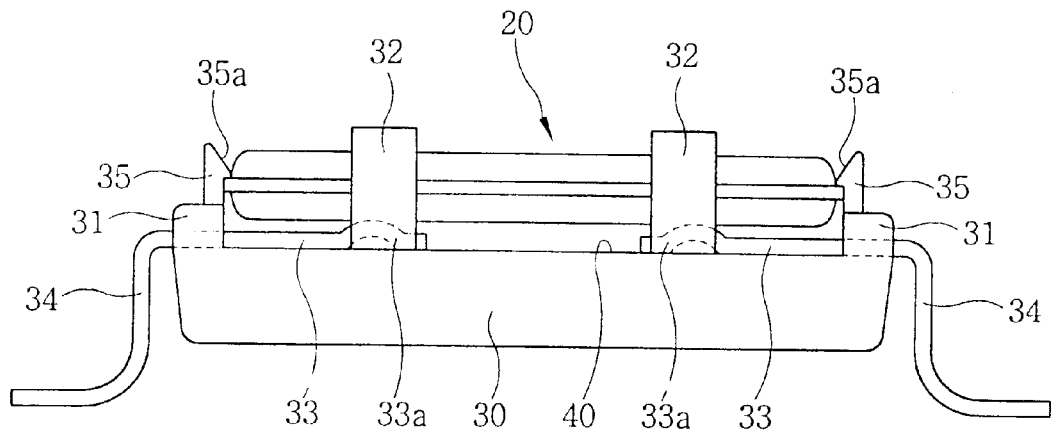
FIG. 4 is an end view of another embodiment of a semiconductor package mounting device.

The plurality of leads also each include an outer connection lead portion 34 that is formed along a side of the body 30 and that extends from the insertion point of the inner connection lead portion 33. The outer connection lead portions 34, as shown in FIG. 3A, are preferably bent in a J-shaped form, but the shape thereof is not limited thereto. For example, the outer connection lead portions 34 may be shaped in various forms such as an gull-shaped form, as shown in FIG. 4. The inner connection lead portions 33 and the outer connection lead portions 34 are made of a conductive material.

A guide hook 35 vertically protrudes from the inner upper surface of each of the protrusions 31. When mounting the semiconductor package 20, the upper or lateral surface of the semiconductor package is supported and retained by the end portions of the guide hooks 35 to prevent the device 20 from moving. The end portions of the guide hooks 35 are inclined toward the inner portion in which the cavity 40 is formed, and they are formed like a hook. This shape facilitates mounting of the semiconductor package 20. In addition, the guide hooks 35 are preferably made of an elastic material, or are formed to be elastically deformable.

Figure 5:
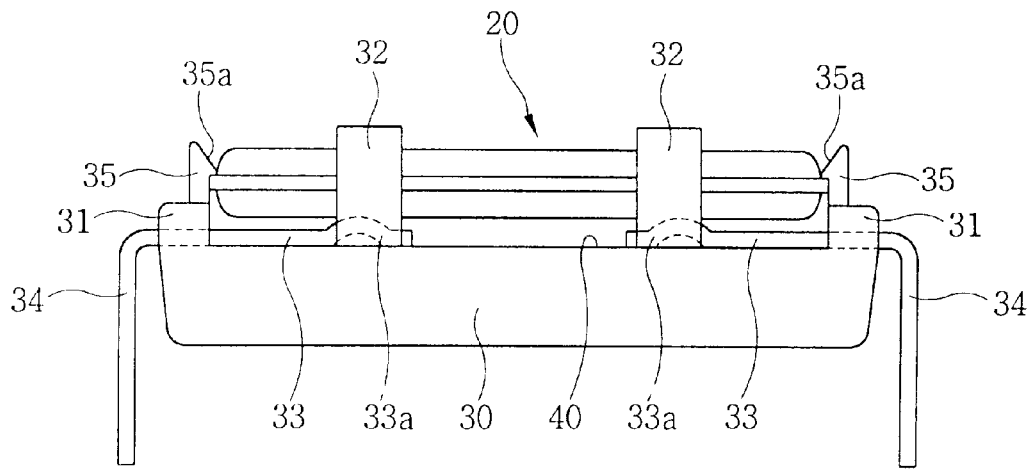
FIG. 5 is an end view of another embodiment of the semiconductor package mounting device.
Figure 6:
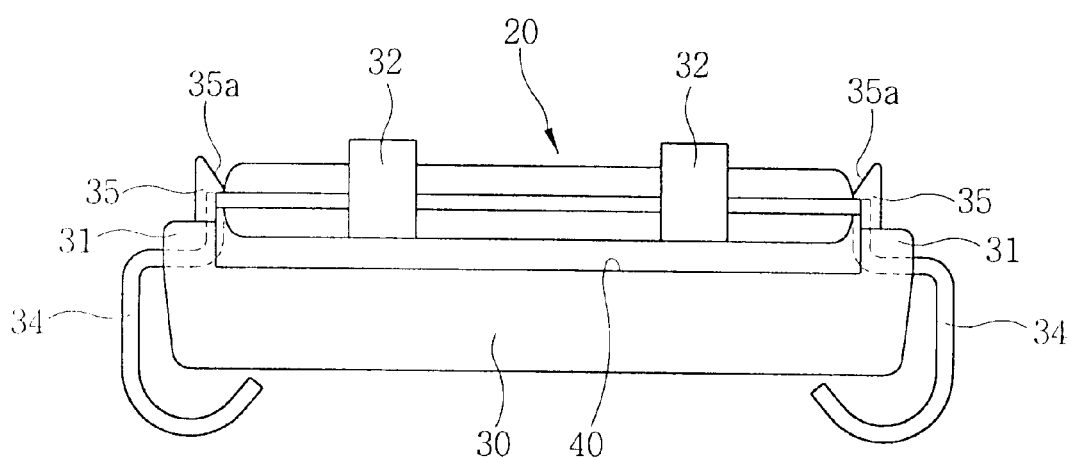
FIG. 6 is an end view of yet another embodiment of the semiconductor package mounting device.

To facilitate mounting the bottom leaded semiconductor package 20 on the device, the inclined surfaces 32a of the guide blocks 32 and the inclined surfaces 35a of the guide hooks 35 are formed to allow the semiconductor package to be slidably guided and mounted thereon. In addition, the guide blocks 32 and the guide hooks 35 support the lateral surfaces of the semiconductor package 20. When the semiconductor package 20 is mounted in the cavity 40, the bottom leads 2a, which are exposed to the outside from the bottom of the package 20, are electrically connected to the inner connection lead portions 33. The upwardly curved portions 33a of the inner connection leads 33 enable more reliable connection. In alternate embodiments, the inner connection leads may include a portion designed to connect with a flush mounted electrical lead 36 formed on a side surface of a semiconductor package that is mounted on the device, as shown in FIG. 6. Thus, electrical signals from the bottom leads 2a of the semiconductor package 20 are accurately transferred to the outside through the outer connection lead portions 34, which extend from the inner connection lead portions 33. To test the semiconductor package, the semiconductor package 20 is stably mounted in the device, and the device is mounted on the a PCB for the test. Because the outer appearance of the mounting device is the same as the outer appearance of a conventional small outline J-leaded (SOJ) semiconductor package or a small outline P-leaded (SOP) semiconductor package, as shown in FIG. 5, the device and attached semiconductor package can be mounted in a testing socket for a conventional SOJ or SOP package.

As described above, with the semiconductor package mounting device of the present invention, it is possible to more stably and easily mount a bottom leaded semiconductor package for testing. It is also possible to overcome the problems of burying solder paste within the bottom leads of the semiconductor package, and to avoid the thermal damage that may occur during the reflow process. In addition, since the outer appearance of a semiconductor package mounting device according to the present invention is the same as the outer appearance of a conventional SOJ or SOP package, an additional bottom leaded semiconductor package test socket is not necessary, and it is possible to test the semiconductor package using the conventional SOJ or SOP package test socket.

The foregoing embodiments are merely exemplary and are not to be construed as limiting the present invention. The present teaching can be readily applied to other types of apparatus. The description of the present invention is intended to be illustrative, and not to limit the scope of the claims. Many alternatives, modifications, and variations will be apparent to those skilled in the art.

What is claimed is:

1. A device for mounting a semiconductor package, comprising:
   a planer shaped body;
   a plurality of spaced-apart protrusions arranged on an upper surface of the body adjacent a first pair of opposing sides of the body;
   a plurality of guide blocks arranged on the upper surface of the body adjacent a second pair of opposing sides of the body;
   a plurality of inner connection leads that extend inwardly from at least one of the first pair of sides of the body;
   a plurality of outer connection leads, each of which extends from one of the inner connection leads, wherein each of the outer connection leads extends along one of the first pair of opposed sides of the body; and
   a plurality of guide hooks disposed on respective upper surfaces of the plurality of protrusions.

2. The device of claim 1, wherein an upper surface of each of the plurality of guide blocks slopes downward toward an inner portion of the body.

3. The device of claim 2, wherein an upper surface of each of the plurality of protrusions slopes downward toward an inner portion of the body.

4. The device of claim 1, wherein a portion of each inner connection lead is bent upwardly away from an upper surface of the body.

5. The device of claim 1, wherein each of said plurality of outer connection leads is J-shaped.

6. The device of claim 1, wherein each of said plurality of outer connection leads is gull-shaped.

7. The device of claim 1, wherein the plurality of protrusions are elastically deformable to allow a semiconductor device to be removably mounted in a cavity located between the plurality of protrusions.

8. The device of claim 1, wherein the plurality of guide blocks are elastically deformable to allow a semiconductor device to be removably mounted in a cavity formed between the plurality of guide blocks.

9. A device for mounting a semiconductor package, comprising:
   a body;
   a plurality of upwardly extending protrusions arranged on an upper surface of the body adjacent a first pair of opposed sides of the body;
   a plurality of guide blocks arranged along the upper surface of the body adjacent a second pair of opposed sides of the body, wherein the plurality of upwardly extending protrusions and the plurality of guide blocks form a cavity for mounting the semiconductor package; and a plurality of leads, each of the plurality of leads having a first end portion that is formed so as to connect with an electrical lead of the semiconductor package mounted in the cavity, a middle portion that extends down a side of the body, and a second end portion that is formed so as to connect with an electrical lead of a semiconductor package mounting socket.

10. The device of claim 9, wherein the first end portion of each of the plurality of leads extends along the upper surface of the body and includes an upwardly extending bent portion designed to connect with a flush mounted electrical lead formed on a bottom surface of the semiconductor package mounted in the cavity.

11. The device of claim 9, wherein the first end portion of each of the plurality of leads includes a portion designed to connect with a flush mounted electrical lead formed on a side surface of the semiconductor package mounted in the cavity.

12. The device of claim 9, wherein an upper surface of each of the plurality of upwardly extending protrusions slopes downward toward the cavity.

13. The device of claim 12, wherein an upper surface of each of the plurality of guide blocks slopes downward toward the cavity.

14. The device of claim 9, wherein an upper surface of each of the plurality of guide blocks slopes downward toward the cavity.

15. The device of claim 9, wherein the second end portion of each of the plurality of leads is J-shaped.

16. The device of claim 9, wherein the second end portion of each of the plurality of leads is gull-shaped.

17. The device of claim 9, wherein the second end portions of the plurality of leads are arranged in a pattern that is substantially similar to one of a small outline J-leaded semiconductor package, a small outline P-leaded semiconductor package and a thin small outline semiconductor package.

* * * * *